United States Patent [19]

Duncan

[11] Patent Number: 5,748,942
[45] Date of Patent: May 5, 1998

[54] EFFICIENT THREE-DIMENSIONAL LAYOUT METHOD FOR LOGIC CELL ARRAYS

[75] Inventor: Robert G. Duncan, Castroville, Calif.

[73] Assignee: Xilinx, Inc., San Jose, Calif.

[21] Appl. No.: 482,139

[22] Filed: Jun. 7, 1995

[51] Int. Cl.$^6$ .................. G06F 3/00; G06F 15/14
[52] U.S. Cl. .................. 395/500; 395/800.1; 395/800.11; 364/725.02; 364/728.05
[58] Field of Search .................. 395/500, 800, 395/700, 800.11, 800.12, 800.17, 326, 919, 964, 800.31, 800.22, 800.1; 364/488–491, 709.09, 725.01, 725.02, 728.03, 728.05, 578; 257/202, 203, 207, 208, 69, 72, 225, 903, 904, 24, 74–77; 326/44

[56] References Cited

U.S. PATENT DOCUMENTS

| | | | |
|---|---|---|---|
| 4,233,602 | 11/1980 | Hamura | 340/752 |
| 5,058,001 | 10/1991 | Li | 395/500 |
| 5,089,862 | 2/1992 | Warner, Jr. et al. | 357/23.1 |
| 5,133,073 | 7/1992 | Jackson et al. | 395/800 |
| 5,157,778 | 10/1992 | Bischoff et al. | 395/800 |
| 5,157,785 | 10/1992 | Jackson et al. | 395/800 |
| 5,274,832 | 12/1993 | Khan | 395/800 |
| 5,506,950 | 4/1996 | Hughes et al. | 395/326 |
| 5,543,640 | 8/1996 | Sutherland et al. | 257/202 |
| 5,548,773 | 8/1996 | Kemeny et al. | 395/800 |

*Primary Examiner*—Jacques H. Louis-Jacques
*Attorney, Agent, or Firm*—Adam H. Tachner; Jeanette S. Harms

[57] ABSTRACT

A method by which a two-dimensional array of logic elements may be interconnected such that they may be modeled as a three-dimensional array, while minimizing routing crossings. The result is an arrangement that is highly efficient for implementation in a silicon die. The preferred model may be extended to a three-dimensional torus where opposing faces of the array are considered to be adjacent. Routing flexibility is increased by increasing local interconnect while minimizing interconnect crossover.

3 Claims, 14 Drawing Sheets

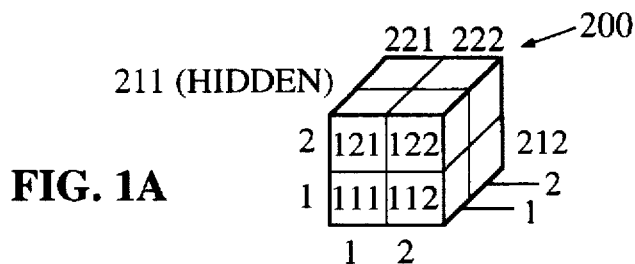
FIG. 1A
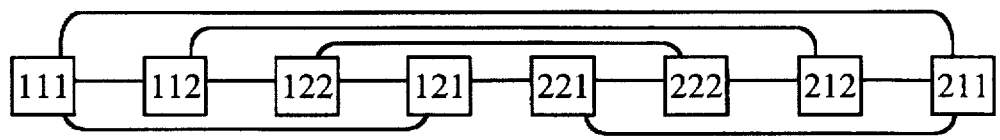
FIG. 1B
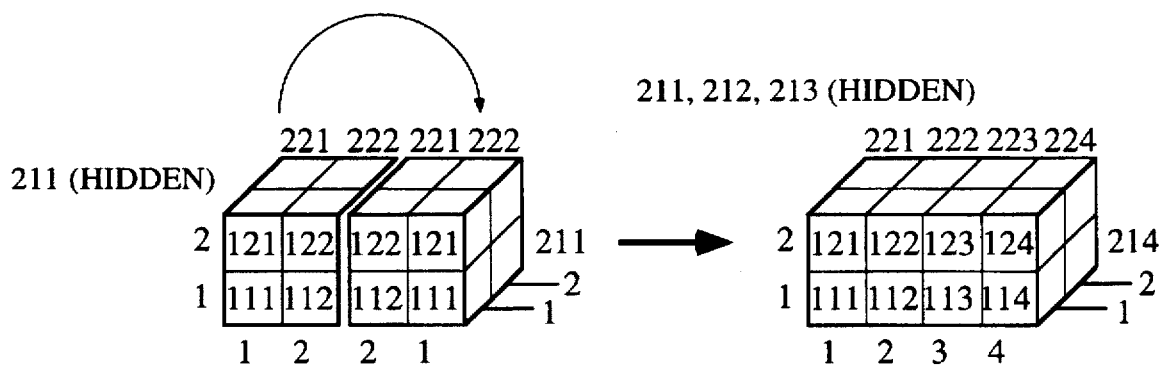
FIG. 2A  FIG. 2B

EFFICIENT THREE-DIMENSIONAL LAYOUT METHOD FOR LOGIC CELL ARRAYS

BACKGROUND OF THE INVENTION

1. Field of the Invention

The invention relates to logic devices and more particularly a method for interconnecting and laying out an array of programmable logic elements on a two-dimensional configurable logic cell array device surface in a manner which minimizes interconnect crossovers.

2. Description of the Related Art

A configurable logic array (CLA) is a matrix of interconnected, programmable logic cells. The individual logic cell function and the active inputs and outputs of each logic cell, including interconnections to other cells, are determined by flip-flops and logic gates within the cell, rather than by physically customizing the array during manufacture. Thus, the individual cell functions and the interconnections between cells are dynamically programmable to provide a wide variety of functions. The greater the number of usable cells in the array capable of being routed together into a desired circuit path, the greater the functional flexibility of the device.

FIG. 9 illustrates a prior art CLA interconnect structure. The interconnect lines shown provide for selective interconnect between adjacent cells. These are known in the art as single-length interconnect lines between logic elements. Also known in the art are multi-length interconnect lines which bypass adjacent cells and directly connect one cell to another cell at some distant location on the device at an accelerated pace.

The CLA designer desires to maximize the amount of interconnect between cells, to ensure broad design compatibility for a device, while minimizing the number of switch points 110—known in the art as programmable interconnect points, or PIPs to accelerate device speed and control costs. The desire to minimize PIPs stems from fabrication requirements. While an architecture with more PIPs provides more options to the router by simplifying routing between cells, each PIP includes a memory cell which adds measurably to the final size and complexity of the device.

A second impetus for minimizing PIPs stems from the electrical characteristics of a configurable array. Every segment of configurable interconnect wire 120 is capacitively loaded by the transistors of all potential connections that can be made from that segment. When a signal is routed through a transistor to another segment, the created network of cells (net) includes the resistance of the transistor. Thus, the delay of a net is the time required to charge or discharge the distributed capacitance of all segments through the resistances of all PIPs. The additional delay across a net from adding a routing segment grows quadratically with the number of PIPs on the net, due to the distributed resistance of the PIPs and the capacitance of the segments. Thus, too much interconnect will slow the device, making larger configurable design implementations less practical.

FIG. 10 illustrates; one approach to this design dilemma. Cells are grouped in blocks, known as configurable logic blocks (CLBs) 130. A group of CLBs forms a CLB sub-array 140. While the adjacent CLBs within a sub-array are directly interconnected to all adjacent CLBs, connection between sub-arrays takes place across a global interconnect channel 150, thereby providing both local and global interconnect access. Both the number of CLBs 130 forming a sub-array 140 and the number of sub-arrays forming a device can be varied according to the performance parameters desired by the designer. This layout type also benefits from the symmetry of the sub-arrays 140 —repeated design elements can be routed identically on different sub-arrays 140 without repeating the time-consuming routing and placement calculation process.

While these and other existing device layouts each have their own advantages and pitfalls, the field is in need of a truly systemic approach to laying out two-dimensional arrays of cells in a manner which allows the designer to quickly visualize his or her ideas, maximize the potential for interconnect, and minimize the number of overlapping interconnect points.

SUMMARY OF THE INVENTION

The present invention includes the mapping of a complex interconnected design into a three-dimensional array of resources. As described herein, three-dimensional mapping provides a logical and minimalist interconnect structure. Thus, three-dimensional mapping is more efficient than mapping into a two-dimensional array which requires a separate, intuitive approach to determining interconnect structure. It is therefore a primary object of the present invention to provide a method of interconnecting a three-dimensional array of logic elements to form a two-dimensional array while minimizing interconnect line crossovers, comprising creating a three-dimensional model including the logic elements, noting by adjacency which of the logic elements are connected to other logic elements in the three-dimensional array, laying out the two-dimensional array of logic elements, and interconnecting the logic elements of the two-dimensional array in accordance with the result of the noting step.

BRIEF DESCRIPTION OF THE DRAWINGS

FIGS. 1A and 1B show an eight-node three-dimensional cell and its two-dimensional equivalent layout structure in the manner of the present invention.

FIGS. 2A, 2B, 2C and 2D show a 2×2×4 three-dimensional array, made up of two of the arrays of FIG. 1, and two equivalent two-dimensional arrays.

DETAILED DESCRIPTION OF THE PREFERRED EMBODIMENT

Three-Dimensional Layout Nomenclature for Basic Cells

The simplest non-trivial three-dimensional logic cell array 200 is a 2×2×2 array, as shown in FIG. 1A. The logic cells of the array are assigned reference numbers that correspond to their locations within the array in the form of "ZYX" to correspond to the location along the appropriate axes, where the front bottom left cell is labeled 111 and the upper right cell is labeled 222. Adjacent faces are locally interconnected.

FIG. 1B shows an efficient two-dimensional layout of the cells in FIG. 1A, where connected lines represent adjacent faces in the three-dimensional array 200. There are many other arrangements of the cell assignments that are equally valid for this two-dimensional topology. However, these other arrangements correspond to reflections and rotations of the three-dimensional array of FIG. 1A and the corresponding two-dimensional layout of FIG. 1B.

The two-dimensional layout of FIG. 1B with connections corresponding to those of the three-dimensional layout of FIG. 1A has at least two important characteristics. First, the interconnecting lines representing the adjacent faces of the three-dimensional cells are all coplanar - they do not cross each other or interconnect. Secondly, there are four cells that are "external" and four cells that are "internal". The external cells may be connected to cells outside the layout without crossing any interconnect lines within the layout. The four internal cells are completely surrounded by connection lines. The external cells will always be cells that occupy a common face of a three-dimensional array, no matter what size. The internal cells will be similarly coplanar. However, the selection of the faces which become the internal and external faces in the two-dimensional layout is arbitrary.

Figure 2C:
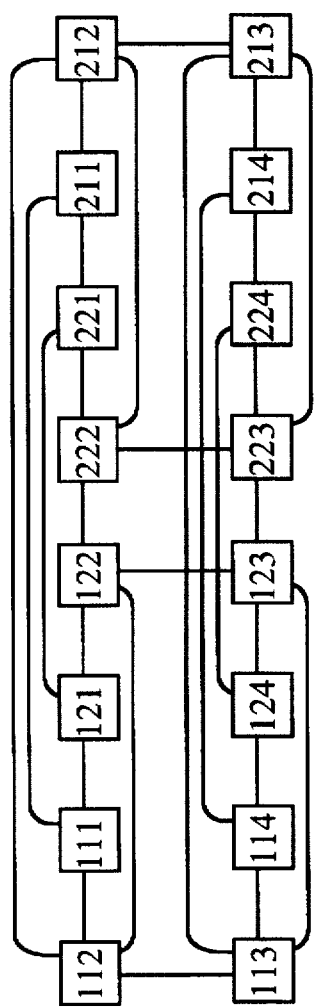

The basic array of FIG. 1A and its two-dimensional layout of FIG. 1B form the building blocks upon which larger and more complex structures may be built. The first step is to combine two such arrays to form a 2×2×4 cell array. FIGS. 2A and 2B show such an array, with two possible two-dimensional layouts in FIGS. 2C and 2D.

Figure 2D:
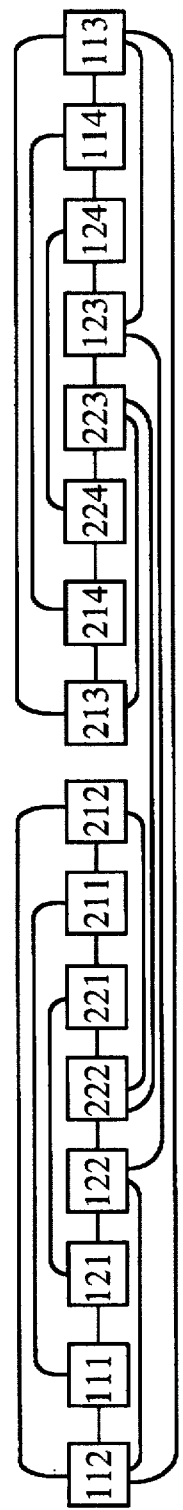

As indicated in FIG. 2A, the basic 2×2×2 array is copied, then the copy is reflected across the X axis and butted up to the original, forming a 2×2×4 array (FIG. 2B). The reflection results in alignment of the newly adjacent cells in the two-dimensional layouts to allow for direct coplanar interconnect. The resulting layout is seen in FIG. 2C. FIG. 2D) shows an alternative coplanar layout for the 2×2×4 array that could be used for building larger arrays, as described below.

Figure 3A:
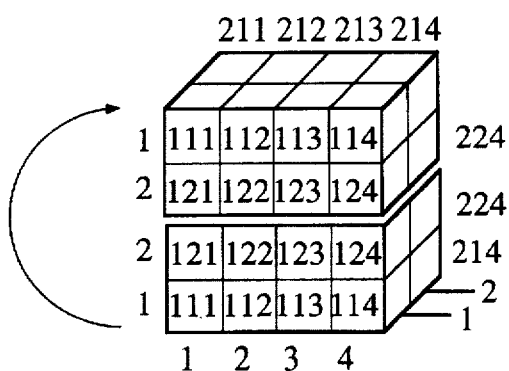
FIGS. 3A, 3B, 3C and 3D show a 2×4×4 three-dimensional array, made up of two of the arrays of FIG. 2, and two equivalent two-dimensional arrays.
Figure 3B:
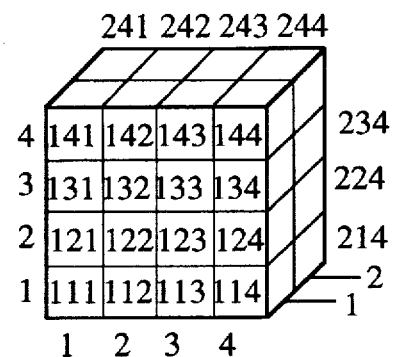
Figure 3C:
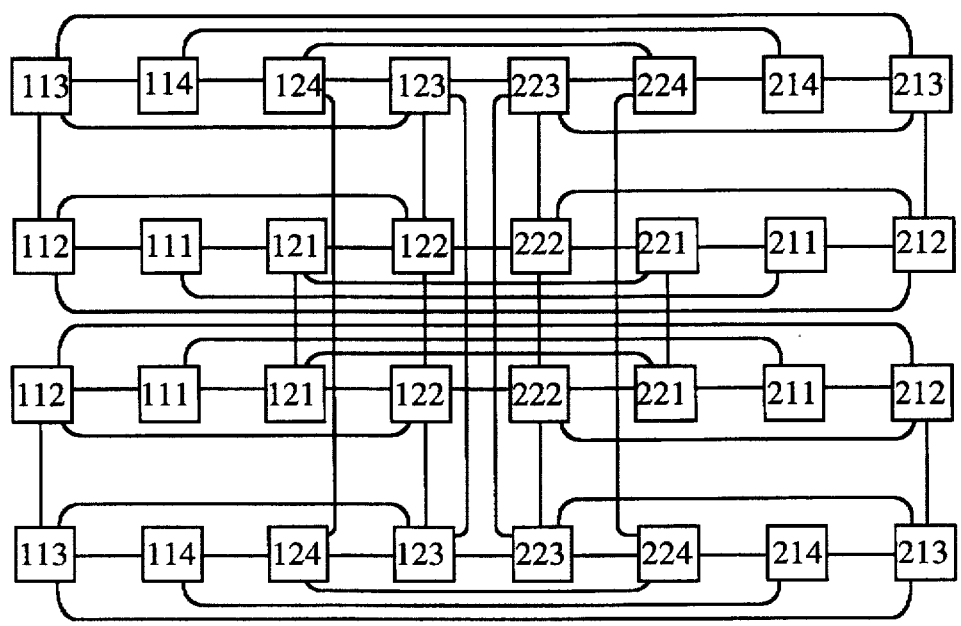
Figure 3D:
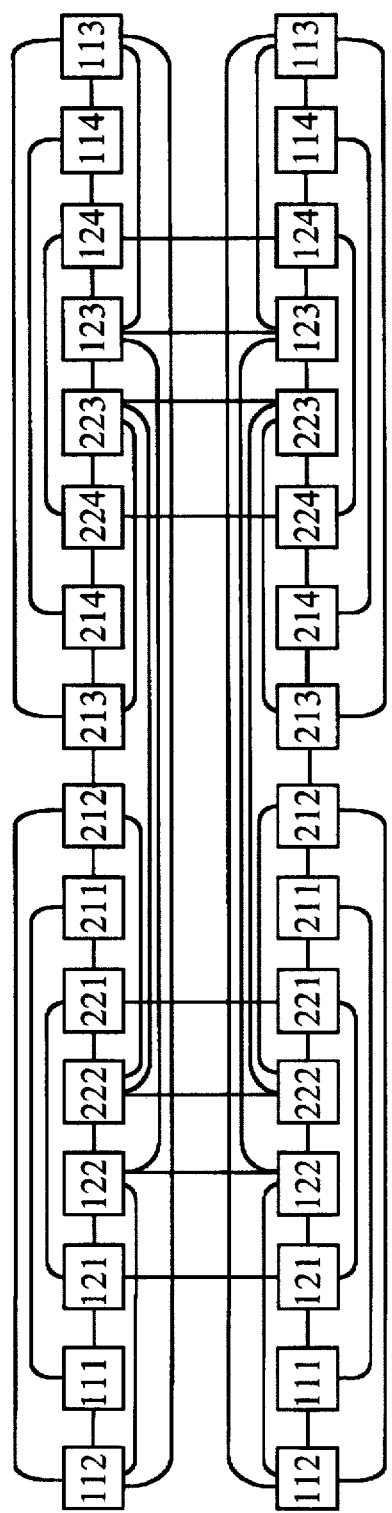
Figure 4A:
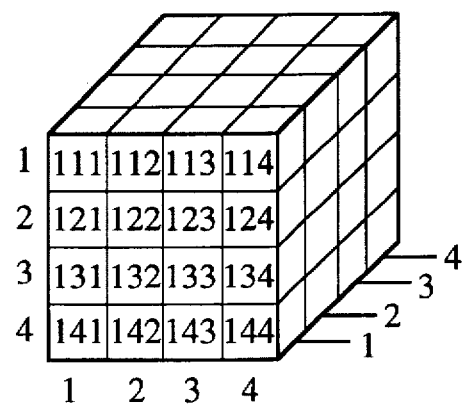
FIGS. 4A and 4B show a 4×4×4 array and an equivalent two-dimensional array.
Figure 4B:
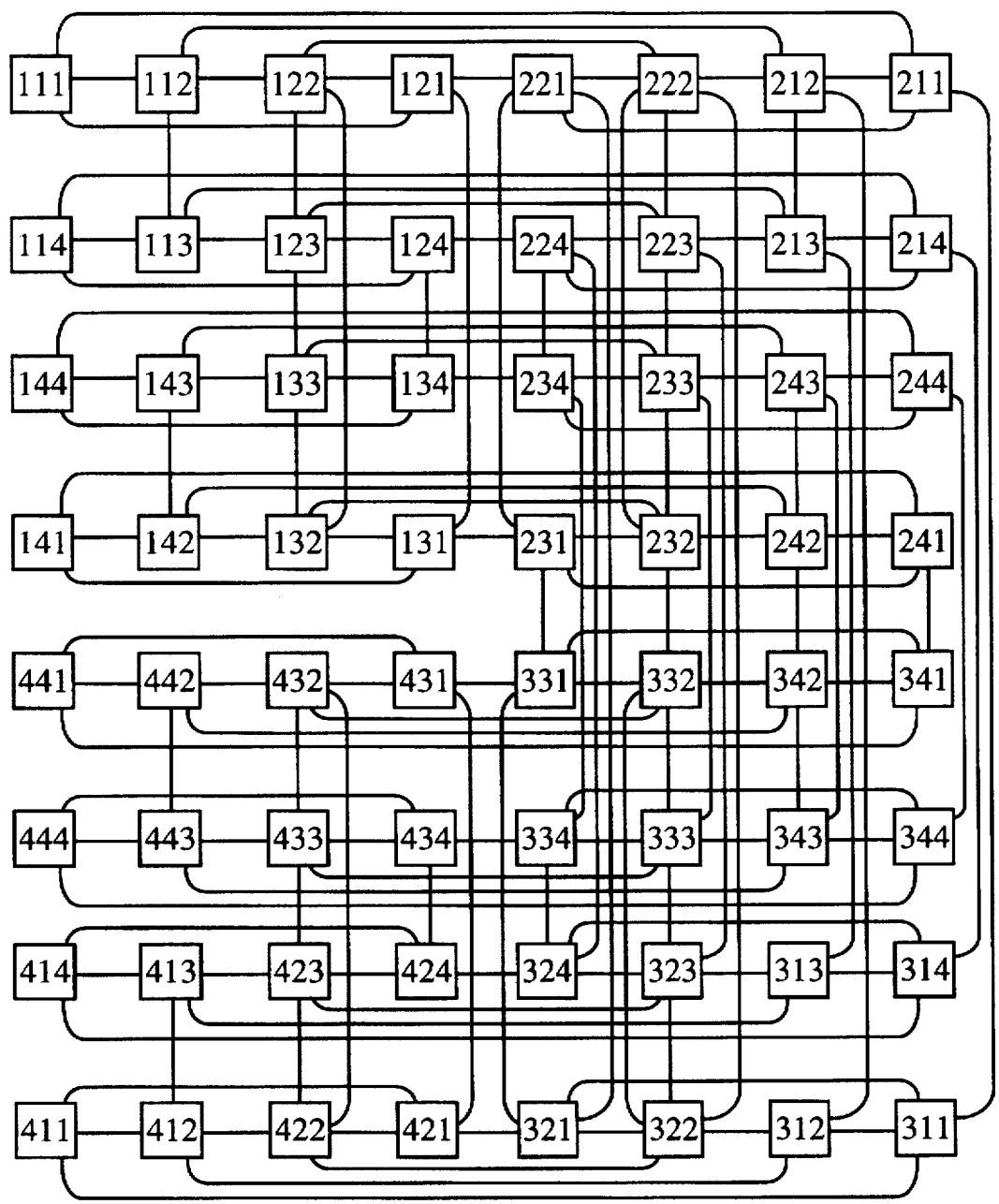

We can again double the size of our array by duplicating the array of FIG. 2B, again reflecting the copy, then concatenating the two to form an array with dimensions 2×4×4. This is shown in FIGS. 3A and 3B, along with two possible two-dimensional layouts in FIGS. 3C and 3D. FIG. 4 shows examples of a still larger array and possible two-dimensional layouts. In all cases, the connectivity lines form two distinctly coplanar groups, one plane for horizontal connections and another plane for vertical connections.

A Preferred Three-dimensional Architecture for Structured Logic

Figure 5A:
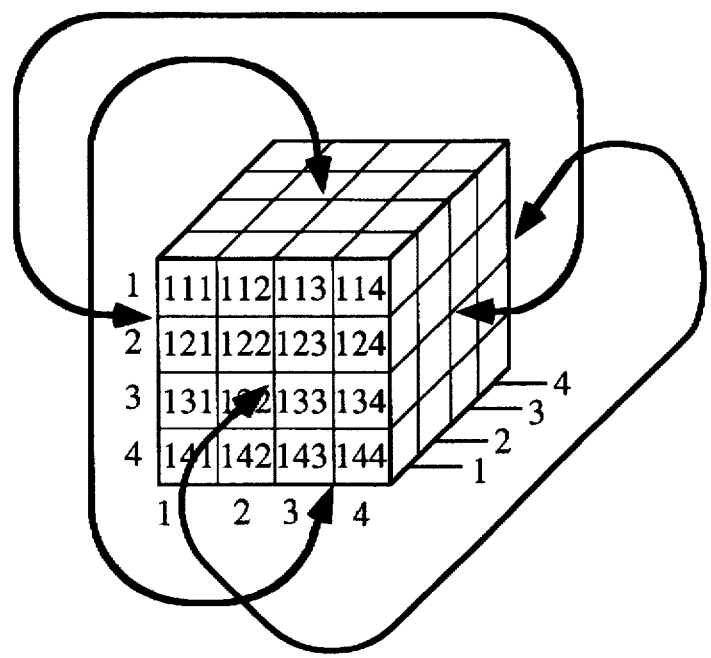
FIGS. 5A and 5B show the 4×4×4 array of FIG. 4A with toroidal interconnect and an equivalent two-dimensional array.
Figure 5B:
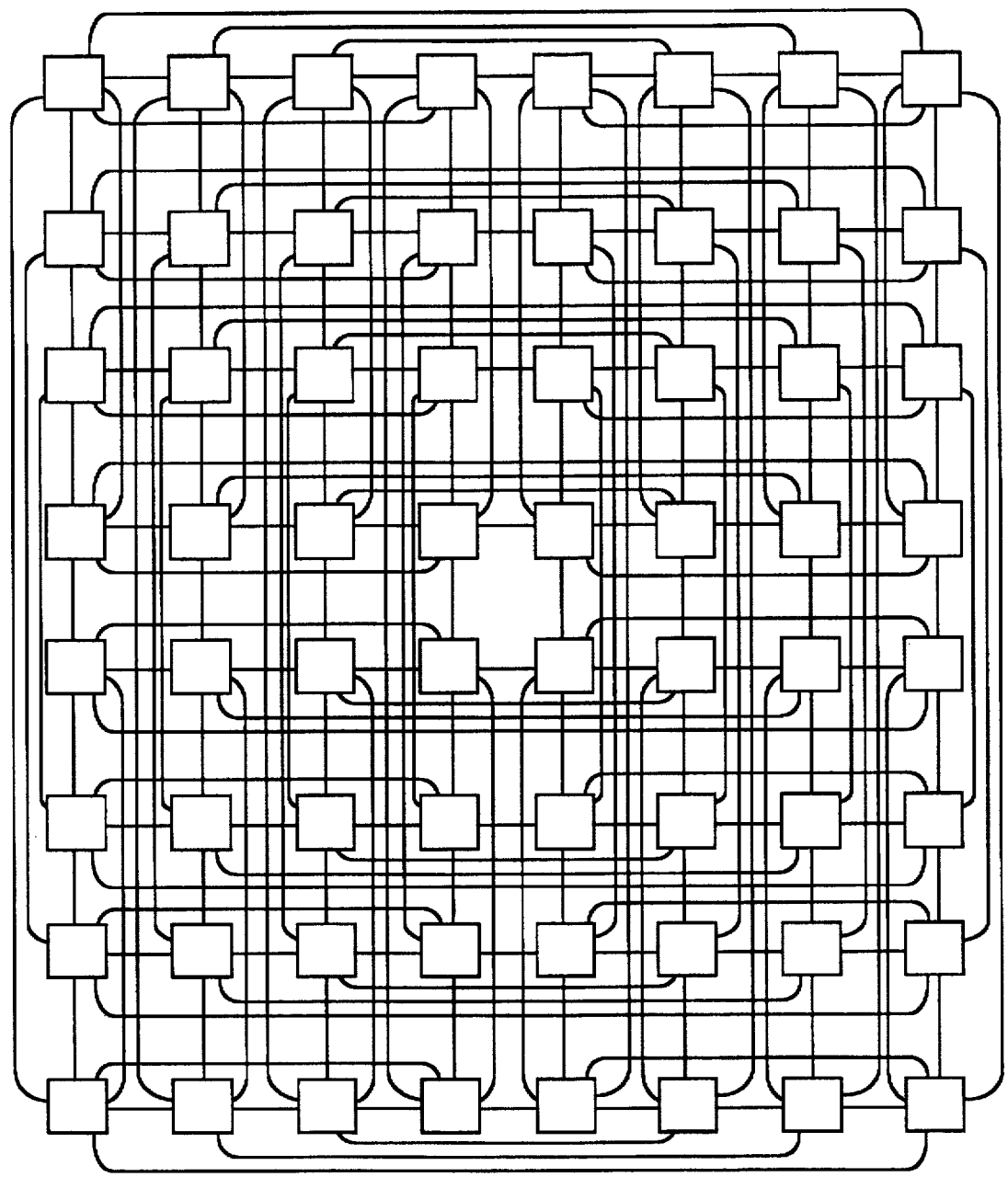

In the preferred embodiment of the apparatus of the present invention, the described connectivity model is expanded even further for use in programmable logic device arrays. The three-dimensional array is extended to a three-dimensional toroidal array by considering opposing faces of the three-dimensional array to be adjacent as shown in FIG. 5A. The two-dimensional layout of such a structure is an extension of the previously described two-dimensional layouts. For example, FIG. 5B shows a two-dimensional layout of a 4×4×4 three-dimensional torus. Comparison of FIG. 5B with FIG. 4B reveals three additional groups of interconnect lines providing full symmetry and, therefore, eased design restrictions over the asymmetric two-dimensional layout of FIG. 4B.

Application to FPGAs

Figure 6:
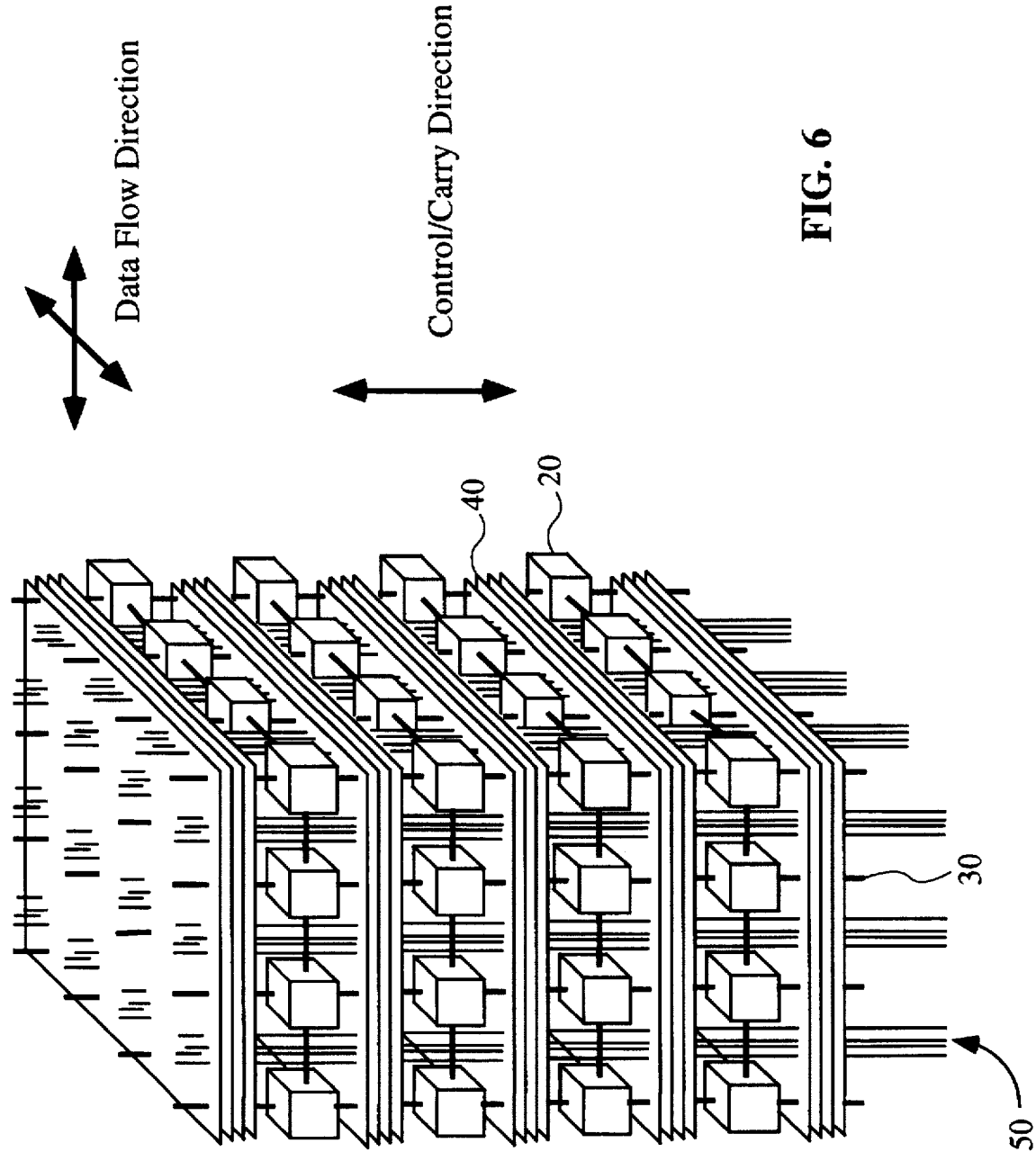
FIG. 6 illustrates a preferred three-dimensional interconnect layout of the present invention.
Figure 10:
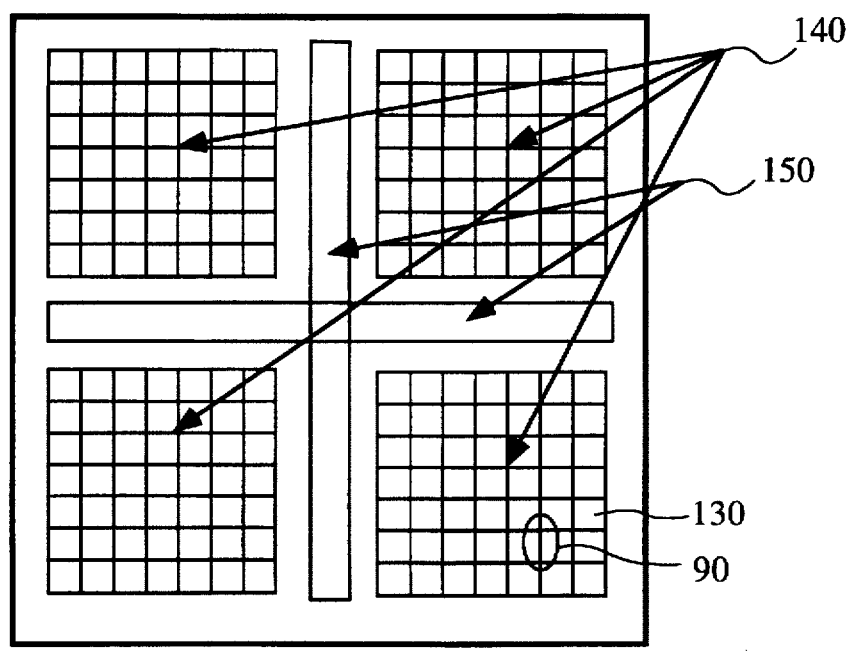
FIG. 10 illustrates a array/sub-array CLA layout.

In a three-dimensional CLB lattice structure model, illustrated in FIG. 6, the cells 20 of the array represent the three-dimensional equivalent of a CLB, and the general interconnect lines 30 are the three-dimensional analog to two-dimensional general purpose local interconnect lines 90 shown in FIG. 10. Using the method of the present invention, the equivalent of long interconnect lines used in two dimensions to directly connect distant cells, such as the routing lines 150 in FIG. 10, can be modelled as connectivity planes 40 in three dimensions. These appear in the three-dimensional model of FIG. 6 as two-dimensional planes, providing common connectivity to all cells with a shared X, Y, or Z coordinate. Long lines 50 may extend in any one of the three-dimensions, thereby providing common connectivity to cells which have two matching coordinates.

Additional Freedom of Movement in Design Using the Three-Dimensional Model

In a conventional two-dimensional logic array, it is very common for a logic design to be data path limited, wherein the data path has a given width (e.g., 8 or 16 bits). Such path limited designs are most efficiently laid out so that the logic associated with a single bit extends in one direction and is duplicated for other bits in the orthogonal direction. Usually the first direction is associated with data flow, while the orthogonal direction is associated with the flow of control or carry signals. Thus, in laying out a design, one is limited to a single degree of freedom—that is, the only undetermined variable is the ordering of logic columns in the data flow direction. Layout for the control and carry signals will logically follow. This limited freedom leads to limited interconnect flexibility and decreased design compatibility.

Applying the method of the present invention, a user can create a layout of this type of design in a three-dimensional array to arrive at a two-dimensional design layout. Now, the logic associated with each bit can extend in two directions, and is then repeated in a third direction orthogonal to the first two directions. We now have poles of logic with control and carry signals traveling along the poles. These poles can be moved in two-dimensions, as long as we provide connectivity planes in the two directions of data flow.

Figure 7A:
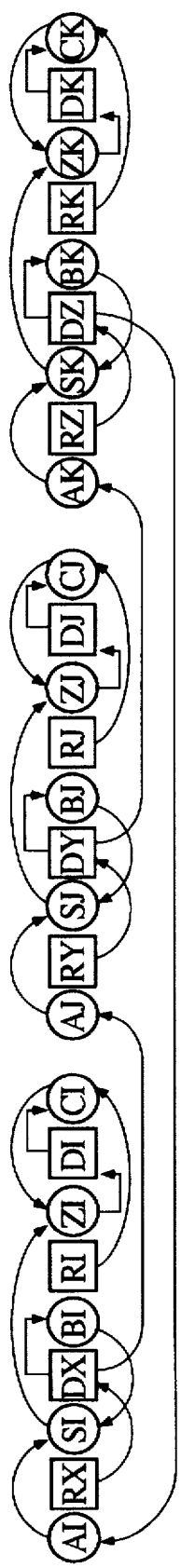
FIGS. 7A and 7B illustrate a single bit-slice of a prior art method of interconnecting logic cells in two-dimensions (7A) and an 8-bit duplication of that slice (7B).
Figure 7B:
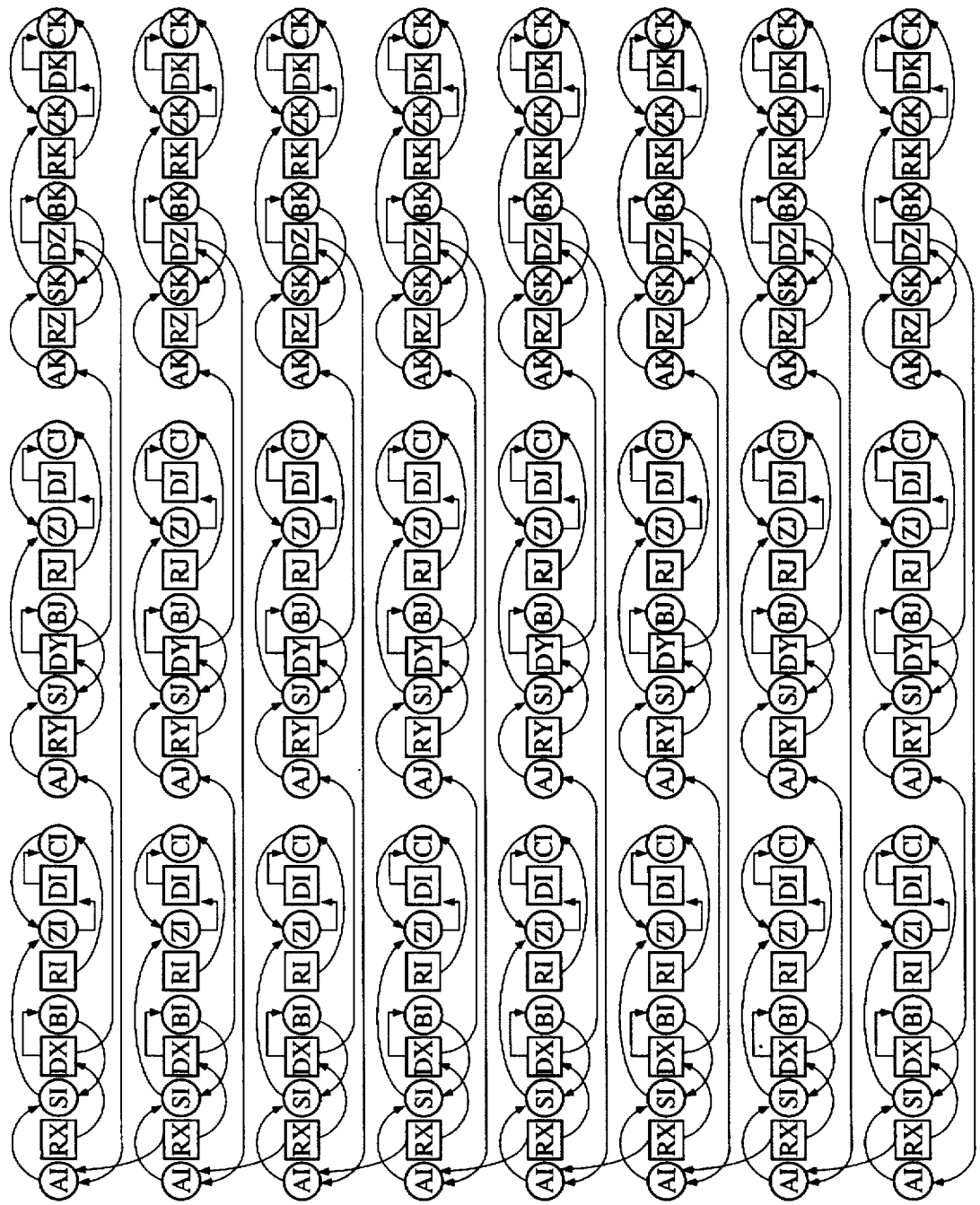
Figure 8A:
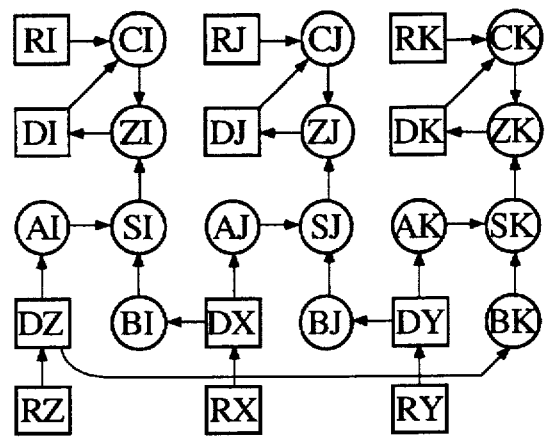
FIGS. 8A and 8B illustrate the advantages of the preferred embodiment of the method of the present invention as applied to the bit slices of FIGS. 7A and 7B, respectively.
Figure 8B:
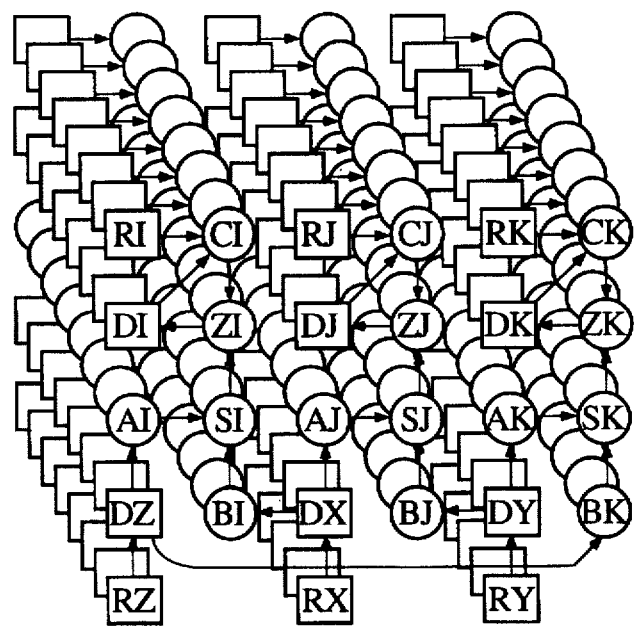
Figure 9:
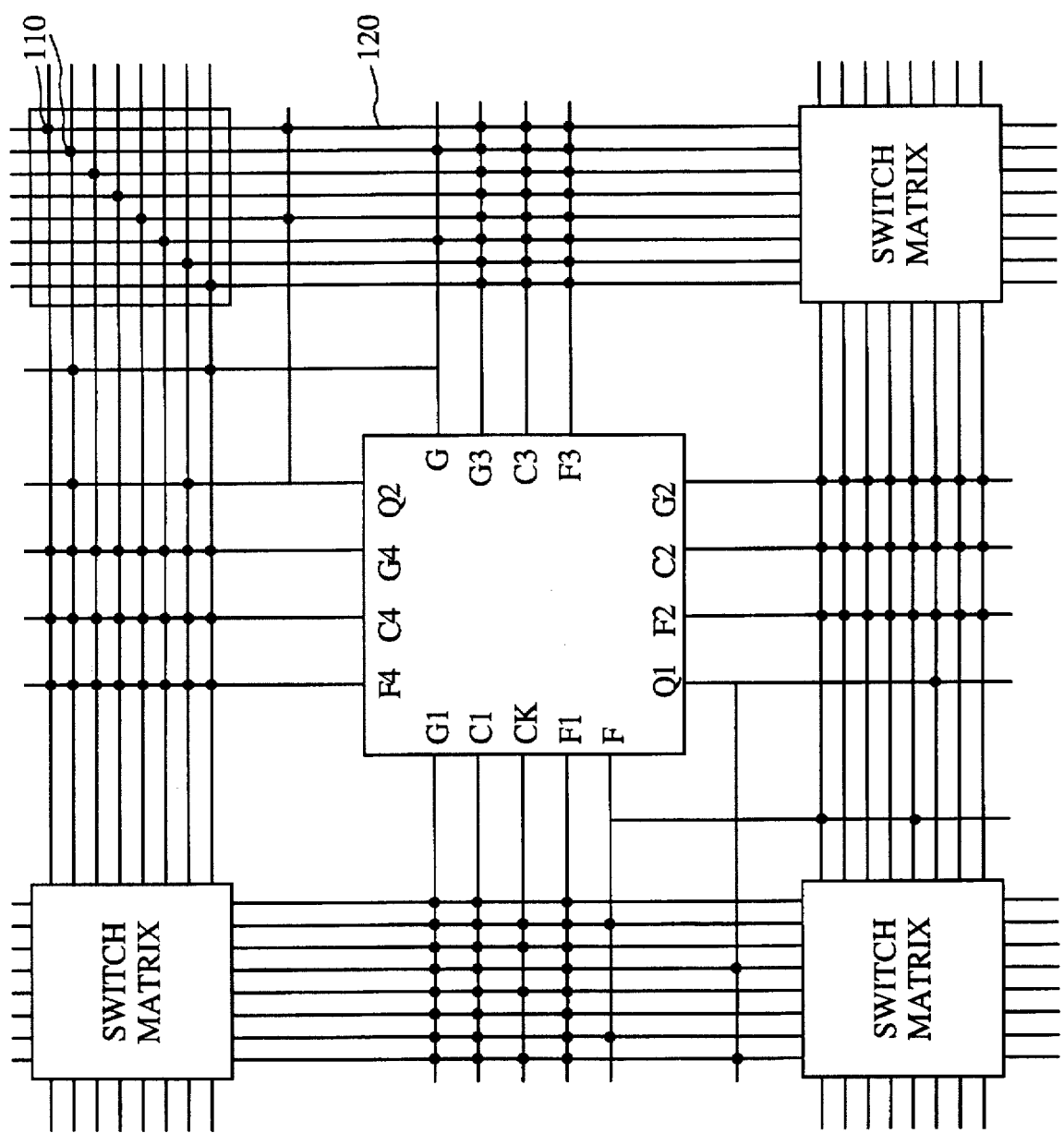
FIG. 9 is a schematic diagram illustrating a cell-to-cell interconnect structure utilizable in a configurable logic array.

Having two degrees of freedom for placing logic is far superior to having only a single degree of freedom in that more direct routability among elements is available. The method of the present invention provides such placement latitude. This advantage is more clearly illustrated in FIGS. 7A, 7B, 8A, and 8B. FIG. 7A provides a single-bit slice of configurable interconnect data on an FPGA, wherein the circles represent function generators (combinatorial logic) and the squares represent flip-flops. The layout was configured using prior art two-dimensional tools. FIG. 7B provides an 8-bit slice of the same information, demonstrating the lack of flexibility in laying out the larger structure using available tools. FIGS. 8A and 8B provide the same functional structure, created with the three-dimensional layout method of the present invention. The second dimension of interconnection flexibility provides for a far more efficient structure which can be easily reflected into two-dimensions using the techniques discussed above.

Thus, the preferred architecture for three-dimensional placement of structured logic is a lattice providing symmetrical general interconnect in all three-dimensions and planar interconnect in two dimensions, as well as linear interconnect and control or carry signal propagation paths in the direction orthogonal to the interconnect planes, as shown in FIG. 6 and created using the technique illustrated in FIGS. 7A, 7B, 8A, and 8B. The structure will also require global interconnect for clock and reset lines, as well as input and output capacity (not shown).

While the present invention has been described with reference to certain preferred embodiments, those skilled in the art will recognize that various modifications and other embodiments may be provided. These other embodiments are intended to fall within the scope of the present invention, and these variations upon and modifications to the embodiment described herein are provided for by the present invention which is limited only by the following claims.

What is claimed is:

1. A method of interconnecting a three-dimensional array of logic elements to form a two-dimensional array while minimizing interconnect line crossovers, comprising the steps of:

creating a three-dimensional model including said logic elements;

noting by adjacency which of said logic elements are connected to other of said logic elements in said three-dimensional array;

laying out said two-dimensional array of logic elements;

interconnecting said logic elements of said two-dimensional array in accordance with the result of said noting step.

2. The method of claim 1, wherein logic elements which are opposite one another in said three-dimensional array are considered adjacent.

3. A recursive method of interconnecting a plurality of logic elements in a two-dimensional (2-D) array to represent a three-dimensional (3-D) array, each logic element being connected to its adjacent neighbors in the three-dimensional array, while minimizing interconnect line crossovers in the two-dimensional array, said method comprising the steps of:

(a) selecting a plurality of subsets from the 3-D array to form a set, said subsets comprising a cubical region of the 3-D array, each said subset occupying one portion of said cubical region;

(b) visiting each of said selected subsets starting with a first subset and continuing with each additional subset in a sequence such that each visited subset is adjacent within the set to the previously visited subset in exactly one dimension, and such that all said subsets are visited, thereby creating an order of introduction to said set;

(c) laying out said set of subsets in the 2-D array, along a selected dimension, preserving the order of introduction to said set from the 3-D array;

(d) each time a subset is laid out, if the subset consists of a single element, then laying said single element out as it appears in said set; and (e) for all subsets including more than a single element, recursively performing steps (a) through (e) while:

(1) considering each subset, in turn, to be a selected set;

(2) choosing a first subset, a visiting order, and a 2-D dimension in such a manner as to align each of said subsets with those laid out in step (c).

* * * * *